(12) United States Patent
Kang et al.

(10) Patent No.: US 11,942,833 B2
(45) Date of Patent: Mar. 26, 2024

(54) INTELLIGENT POWER GENERATION MODULE

(71) Applicants: LG Magna e-Powertrain Co., ltd., Incheon (KR); AVL SOFTWARE AND FUNCTIONS GMBH, Regensburg (DE)

(72) Inventors: Hanbyul Kang, Seoul (KR); Kyunghoon Lee, Seoul (KR); Robert Poschl, Judendorf-Strassengel (DE); Gernot Fuckar, Graz (DE); Markus Preuss, Regensburg (DE); Florian Bodensteiner, Regensburg (DE); Deukhyun Hwang, Seoul (KR)

(73) Assignees: LG Magna e-Powertrain Co., Ltd., Incheon (KR); AVL SOFTWARE AND FUNCTIONS GMBH, Regensburg (DE)

( * ) Notice: Subject to any disclaimer, the term of this patent is extended or adjusted under 35 U.S.C. 154(b) by 293 days.

(21) Appl. No.: 17/479,642

(22) Filed: Sep. 20, 2021

(65) Prior Publication Data
US 2022/0006350 A1     Jan. 6, 2022

Related U.S. Application Data

(63) Continuation of application No. PCT/KR2019/003260, filed on Mar. 20, 2019.

(51) Int. Cl.
*H02K 11/00* (2016.01)
*H02K 3/50* (2006.01)
(Continued)

(52) U.S. Cl.
CPC .............. *H02K 11/33* (2016.01); *H02K 3/50* (2013.01); *H02K 5/203* (2021.01); *H02K 7/116* (2013.01);
(Continued)

(58) Field of Classification Search
CPC .......... H02K 11/33; H02K 3/50; H02K 5/203; H02K 7/116; H02K 9/19; H02K 9/193;
(Continued)

(56) References Cited

U.S. PATENT DOCUMENTS

| 8,629,586 B2 | 1/2014 | Minemura et al. |
| 2010/0077786 A1 | 4/2010 | Siegenthaler et al. |

(Continued)

FOREIGN PATENT DOCUMENTS

| CN | 101842973 | 9/2010 |
| CN | 102782998 | 11/2012 |

(Continued)

OTHER PUBLICATIONS

Extended European Search Report in European Appln. No. 19920611.1, dated Oct. 11, 2022, 10 pages.
(Continued)

*Primary Examiner* — Thomas Truong
(74) *Attorney, Agent, or Firm* — Fish & Richardson P.C.

(57) ABSTRACT

An intelligent power generation module includes a motor having a motor housing; a cooling water flow path; a first oil flow path extending along a circumferential direction of the motor housing such that oil flows through one end portion of the motor housing; a plurality of first injection nozzles being spaced apart from each other in a circumferential direction of the first oil flow path and configured to inject the oil into the motor housing; an oil injection housing mounted at the other end portion of the motor housing; a second oil flow path formed along a circumferential direction of the oil injection housing such that oil flows inside the housing for oil injection; and a plurality of second injection nozzles being spaced apart from each other in a circumferential direction of the second oil flow path and configured to inject the oil into the motor housing.

20 Claims, 13 Drawing Sheets

(51) Int. Cl.
- *H02K 5/20* (2006.01)
- *H02K 7/116* (2006.01)
- *H02K 9/19* (2006.01)
- *H02K 9/193* (2006.01)
- *H02K 9/22* (2006.01)
- *H02K 11/33* (2016.01)
- *B60K 11/02* (2006.01)

(52) U.S. Cl.
CPC ............... *H02K 9/19* (2013.01); *H02K 9/193* (2013.01); *H02K 9/223* (2021.01); *B60K 11/02* (2013.01); *H02K 2203/09* (2013.01)

(58) Field of Classification Search
CPC .... H02K 9/223; H02K 2203/09; B60K 11/02; B60K 2001/003; B60K 2001/006; B60K 1/00; B60Y 2400/61; H05K 7/20
See application file for complete search history.

(56) References Cited

U.S. PATENT DOCUMENTS

| | | |
|---|---|---|
| 2012/0313465 A1 | 12/2012 | Prix |
| 2016/0105083 A1 | 4/2016 | Ishimaru et al. |
| 2016/0254719 A1* | 9/2016 | Pondelek ............ F16H 61/0006 310/54 |
| 2017/0207683 A1 | 7/2017 | Anghel et al. |
| 2018/0287452 A1* | 10/2018 | Kim ....................... H02K 5/203 |

FOREIGN PATENT DOCUMENTS

| | | |
|---|---|---|
| CN | 105099084 | 11/2015 |
| CN | 204835833 | 12/2015 |
| CN | 108667215 | 10/2018 |
| CN | 109217541 | 1/2019 |
| EP | 2760113 | 7/2014 |
| EP | 3007333 | 4/2016 |
| EP | 3382858 | 10/2018 |
| JP | 2004-180376 | 6/2004 |
| JP | 2006-166554 | 6/2006 |
| JP | 2007-116807 | 5/2007 |
| JP | 2012-105487 | 5/2012 |
| JP | 2016-176360 | 10/2016 |
| JP | 2018-057112 | 4/2018 |
| KR | 10-2015-0062529 | 6/2015 |
| KR | 20180010129 | 1/2018 |
| WO | WO 2013080747 | 6/2013 |

OTHER PUBLICATIONS

Office Action in Chinese Appln. No.201980094401.9, dated Jun. 12, 2023, 34 pages (with English translation).

Notice of Allowance in Chinese Appln. No.201980094401.9, dated Oct. 26, 2023, 14 pages (with English translation).

* cited by examiner

INTELLIGENT POWER GENERATION MODULE

CROSS-REFERENCE TO RELATED APPLICATION

This application is a continuation of International Application No. PCT/KR2019/003260, filed on Mar. 20, 2019, the contents of which is hereby incorporated by reference in its entirety.

TECHNICAL FIELD

The present disclosure relates to an intelligent power generation module having a motor cooling structure of an oil-water combined cooling type.

BACKGROUND

Electric vehicles (including hybrid vehicles) having an electric motor as a driving source have excellent fuel efficiency and thus have been released as future vehicles.

In general, an Intelligent Power Generation Module (IPGM) is a device including an electric motor, an inverter, and a gearbox.

The electric motor includes a rotor and a stator, and the rotor may be rotatably provided inside the stator.

The stator includes a stator coil wound around a stator core. When current flows through the stator coil to rotate the rotor, heat is generated in the stator coil. Technologies for cooling the heat generated in the electric motor have been developed.

As for an electric motor used in an electric vehicle, the cooling of heat generated in the electric motor plays an important role in achieving a smaller and more efficient electric motor.

Electric motor cooling methods may include an indirect cooling method for indirectly cooling down a motor by circulating cooling water in a housing, and a direct cooling method for directly cooling down a motor by spraying oil onto a stator or a rotor.

Some IPGM cooling structures include a type 1 structure that uses oil to cool the motor and water to cool the inverter, and a type 2 structure that uses cooling water to cool both the motor and inverter.

Both the type 1 and type 2 structures selectively use one of the cooling fluids, namely, oil and cooling water, for cooling the motor. However, there is no motor cooling structure that employs both of the two types.

Further, the direct cooling method that uses oil has high cooling efficiency and cooling performance, compared to the indirect cooling method that uses cooling water. Thus, research and development on the direct cooling method have been actively carried out recently.

Some rotary electric machines have a cooling mechanism in which two outlets are formed in a cooling water supply pipe located at an upper portion of a stator such that oil can be supplied to right and left sides of an end coil.

However, in the structure of dropping oil from the upper portion of the stator as in the related art, there is a need of a structure capable of spraying oil to the whole section of a stator coil along a circumferential direction of the stator coil, for the purpose of improving cooling performance of the motor even when the motor is inclined to one side due to turning, climbing, acceleration and deceleration of a vehicle. Further, there is a need of a new manifold structure design for spraying the oil to the whole section of the stator coil along the circumferential direction.

Also, there may be a section in which an end turn of the stator coil is not wetted by the oil, depending on a spray position or angle of oil outlets.

SUMMARY

The present disclosure was invented to solve the problems of the related art. One aspect of the present disclosure is to provide an intelligent power generation module having a simultaneous cooling structure for an electric motor using oil and cooling water.

Another aspect of the present disclosure is to provide an intelligent power generation module capable of wetting an entire section of a stator coil by oil, by spraying the oil to the stator coil around the whole 360-degree section of a stator in a circumferential direction of the stator.

In order to achieve these and other advantages and in accordance with the purpose of this specification, as embodied and broadly described herein, there is provided an intelligent power generation module including an electric motor including a motor housing in which a stator and a rotor are accommodated, an inverter including an inverter housing in which a capacitor, an IGBT, and bus bars are accommodated, a cooling water flow path defined in the motor housing such that the cooling water flows therein, a first oil flow path being defined at one end portion of the motor housing in a longitudinal direction of the motor housing and extending along a circumferential direction such that oil flows therethrough, a plurality of first injection nozzles disposed to be spaced apart from one another in the circumferential direction of the first oil flow path to spray the oil into an inner space of the motor housing, an oil injection housing mounted on another end portion of the motor housing in the longitudinal direction of the motor housing, a second oil flow path defined at the oil injection housing along the circumferential direction such that oil flows therethrough, and a plurality of second injection nozzles disposed to be spaced apart from one another in the circumferential direction of the second oil flow path to spray the oil into the inner space of the motor housing.

According to one implementation, the motor housing may have a dual-wall structure having an outer wall and an inner wall spaced apart in a radial direction, and may include a first oil flow path forming part defining the first oil flow path between the outer wall and the inner wall. The plurality of first injection nozzles may extend in all sections of 360 degrees in the radial direction.

According to one implementation, the module may further include a gearbox having a gearbox housing for accommodating gears therein, and configured to decelerate speed of the electric motor.

According to one implementation, the gearbox housing may include a second oil flow path forming part disposed to face the first oil flow path forming part to define the first oil flow path along with the first oil flow path forming part.

According to one implementation, the oil injection housing may include an oil manifold having a dual-wall structure having an outer wall and an inner wall spaced apart in a radial direction, and defining the second oil flow path between the outer wall and the inner wall. Further, the oil injection housing may include a power connector cover portion protruding upward from an upper portion of the oil manifold to surround a power connector for applying power to the stator coil. Moreover, the oil injection housing may include an oil sump cover portion protruding downward from a lower portion of the oil manifold to cover an oil sump disposed in a lower portion of the motor housing to temporarily store oil.

According to one implementation, the module may further include an oil pump mounted to a front side of the motor housing to transfer oil temporarily stored in a lower portion of the motor housing to the plurality of first injection nozzles and the plurality of second injection nozzles.

According to one implementation, the module may further include a heat exchanger installed on one side surface of the motor housing to exchange heat between the cooling water and the oil.

According to one implementation, the module may further include an oil distribution flow path that is defined at an outer circumferential surface of the motor housing, extends in the longitudinal direction to cross the heat exchanger in the longitudinal direction, and is configured to distribute oil to the first oil flow path and the second oil flow path, respectively. Further, the module includes an oil discharge port disposed in the heat exchanger to fluidly communicate with the oil distribution flow path to discharge oil cooled by the heat exchanger to the oil distribution flow path.

According to one implementation, the motor housing and the inverter housing may be integrally formed with each other, and the inverter housing may extend from an upper end of an outer circumferential portion of the motor housing in a tangential direction.

According to one implementation, the inverter housing may be open upward. The inverter may include a cooling plate mounted to cover an open upper portion of the inverter housing and provided with a cooling water flow path forming groove on an upper surface thereof such that the cooling water flows to cool down the capacitor, the IGBT, and the bus bars. The inverter may further include an inverter cover mounted to cover an upper surface of the cooling plate.

According to one implementation, the capacitor, the IGBT, and the bus bars may be mounted while being suspended upside down from a lower surface of the cooling plate. A power connector for applying three-phase power to the electric motor may be mounted on an upper portion of the stator coil. The bus bars may be disposed close to the power connector in the tangential direction. The capacitor may be disposed away from the power connector in the tangential direction, and the IGBT may be disposed between the capacitor and the bus bars.

According to one implementation, the cooling water flow path may include a plurality of heat-exchange cells extending in the longitudinal direction of the motor housing and spaced apart from one another in the circumferential direction of the motor housing, a plurality of partition walls each disposed between adjacent heat-exchange cells of the plurality of heat-exchange cells to partition the plurality of heat-exchange cells, and a plurality of communication holes formed through the plurality of partition walls such that the plurality of heat-exchange cells fluidly communicate with one another in the circumferential direction.

According to one implementation, the stator may include a plurality of ear parts protruding radially outward from an outer circumferential surface of a stator core to couple the stator and the motor housing to each other by a plurality of bolts. The plurality of ear parts may accommodate the plurality of bolts therein. The motor housing may include a plurality of ear part accommodating portions protruding radially outward from an outer circumferential surface of the motor housing to accommodate the plurality of ear parts, respectively. The plurality of partition walls and the plurality of ear part accommodating portions may be alternately disposed along the circumferential direction of the motor housing.

According to one implementation, the plurality of communication holes may be disposed at front end portions of the partition walls or rear end portions of the ear part accommodating portions, respectively.

According to one implementation, a cooling water inlet port may be formed through an inverter cover mounted to cover the inverter housing, such that the cooling water flows into the inverter housing through the cooling water inlet port. Further, a cooling water outlet port may be formed through the heat exchanger, such that the cooling water heat-exchanged with the oil is discharged from the heat exchanger to outside through the cooling water outlet port.

Hereinafter, effects of an intelligent power generation module according to the present disclosure will be described.

First, a motor housing defines a cooling water flow path that extends in an axial direction for the flow of cooling water and an oil flow path that extends in a circumferential direction for the flow of oil, such that an electric motor can be cooled by both the cooling water and the oil, thereby improving cooling performance and output of the electric motor.

Second, a plurality of first injection nozzles may be disposed in a spaced manner at a first oil flow path along its entire length (all sections) around 360 degrees in a circumferential direction. The first oil flow path is formed in the circumferential direction at an inner side of a rear end portion of the motor housing in a longitudinal direction. Further, a plurality of second injection nozzles may be disposed in a spaced manner at a second oil flow path along the circumferential direction. The second oil flow path is formed in the circumferential direction inside an oil injection housing mounted to a front end portion of the motor housing in the longitudinal direction. Accordingly, oil can be sprayed directly onto an end turn of a stator coil in 360 degrees of the all sections through the plurality of first injection nozzles and second injection nozzles, thereby enhancing heat dissipation performance of the stator coil.

As oil is sprayed in all the sections of 360 degrees, the cooling performance of the oil can be uniformly maintained in the circumferential direction of the stator coil even when an electronic vehicle turns, travels uphill or downhill, or is accelerated/decelerated. Further, it can prevent an occurrence of an oil cooling dead zone in which a portion of the stator coil is not wetted by the oil.

Third, the cooling flow path of the motor housing may be configured as an axial flow path extending in the axial direction, which can be manufactured by die casting. The motor housing does not have to be formed by gravity casting that has been employed to form a spiral flow path in related art, thereby improving productivity.

Fourth, the electric motor can employ a cooling structure that can only use cooling water without an oil cooling structure, if necessary. For example, a low-cost product can be configured to have a cooling structure only using cooling water without an oil pump and a heat exchanger.

Fifth, a high output electric motor can employ a cooling structure simultaneously using both oil and cooling water so as to continuously maintain a high output compared to a maximum output (e.g., 60% of the maximum output).

Sixth, an inverter and an electric motor can be configured by a single integrated housing, thereby reducing a manufacturing cost and improving strength.

Seventh, the cooling water flow path can extend in the axial direction and have a zigzag shape along the circumferential direction. Therefore, even when the stator is not press-fitted into the motor housing but is bolted to the motor housing through ear parts being formed at four places of the stator core, the cooling water flow path can be constructed such that the cooling water can circulate while avoiding the positions of bolting holes.

Eighth, a capacitor, an IGBT, and bus bars of the inverter can be suspended compactly upside down from a lower surface of a cooling plate, so as to be cooled simultaneously by cooling water, thereby improving cooling performance of the inverter. Those electric components such as the capacitor of the inverter can be mounted upside down so as to reduce length of the bus bars for connection with a three-phase AC power source of the electric motor, which may reduce an amount of heat generated in the bus bars and increase cooling efficiency accordingly.

Ninth, cooling water can indirectly cool down the inverter and the electric motor while moving along inner flow paths of an inverter housing and a motor housing and then absorb heat through heat exchange with oil in the heat exchanger, thereby enhancing heat dissipation performance.

Tenth, oil can be sprayed through a plurality of injection nozzles formed at the motor housing at all sections thereof around 360 degrees in the circumferential direction. Therefore, a guide ring for oil dropping is not needed, thereby reducing the number of components and assembly processes and reducing manufacturing costs.

DETAILED DESCRIPTION

Description will now be given in detail according to exemplary implementations disclosed herein, with reference to the accompanying drawings.

Figure 1:
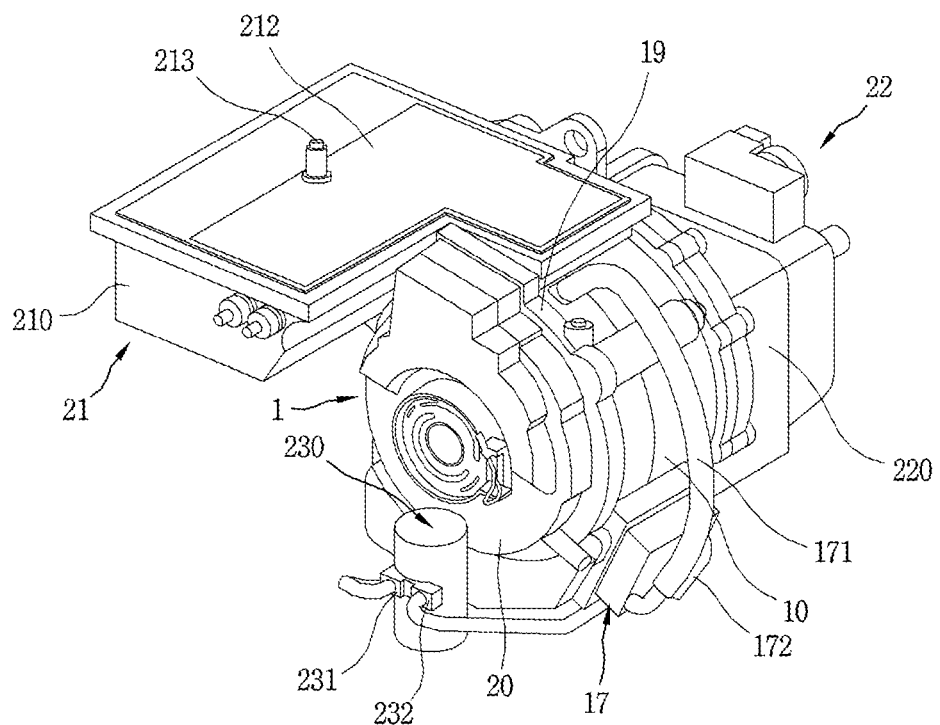
FIG. 1 is a perspective view of an intelligent power generation module (IPGM) in accordance with implementations of the present disclosure.
Figure 2:
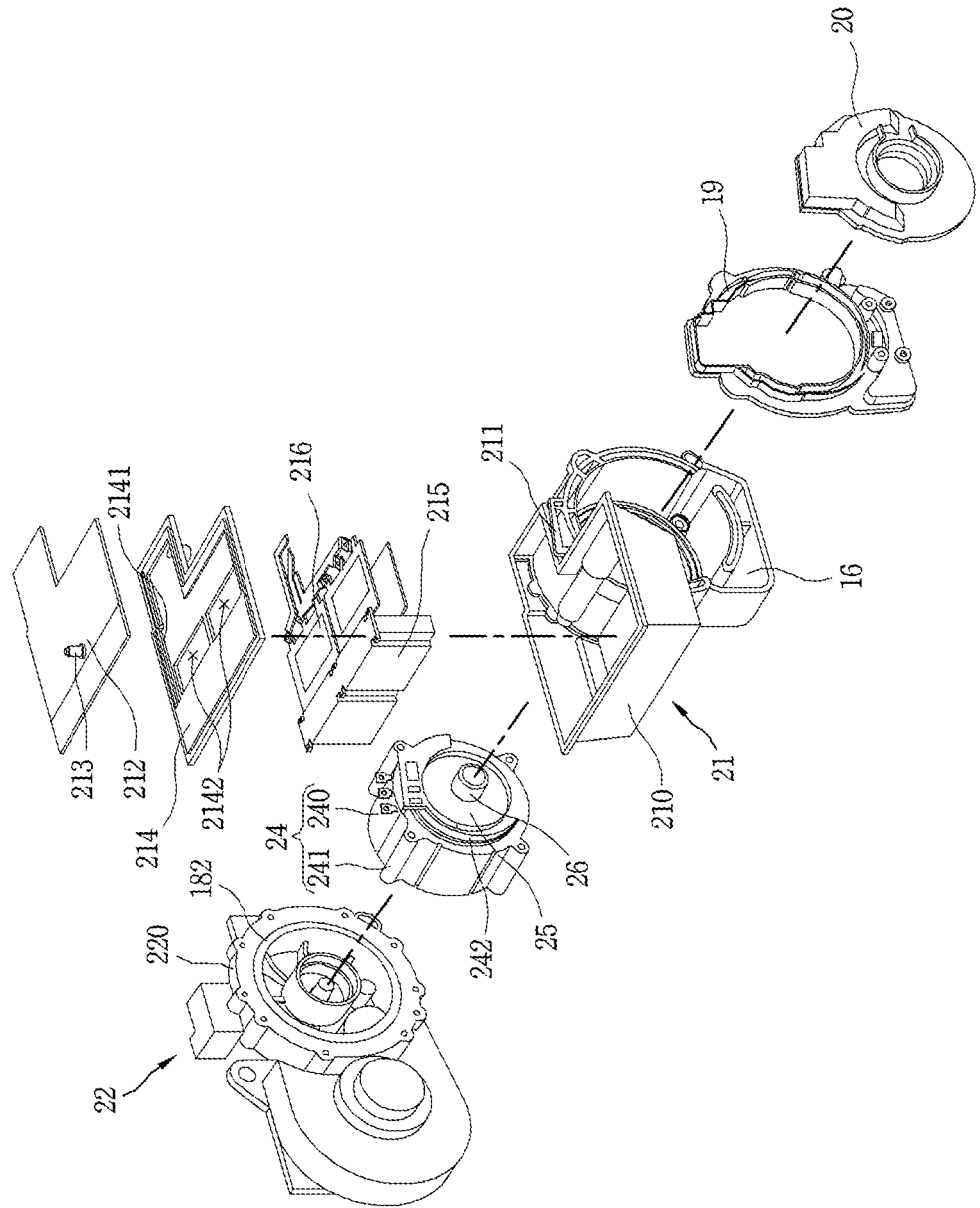
FIG. 2 is an exploded view of the IPGM in FIG. 1.
Figure 3:
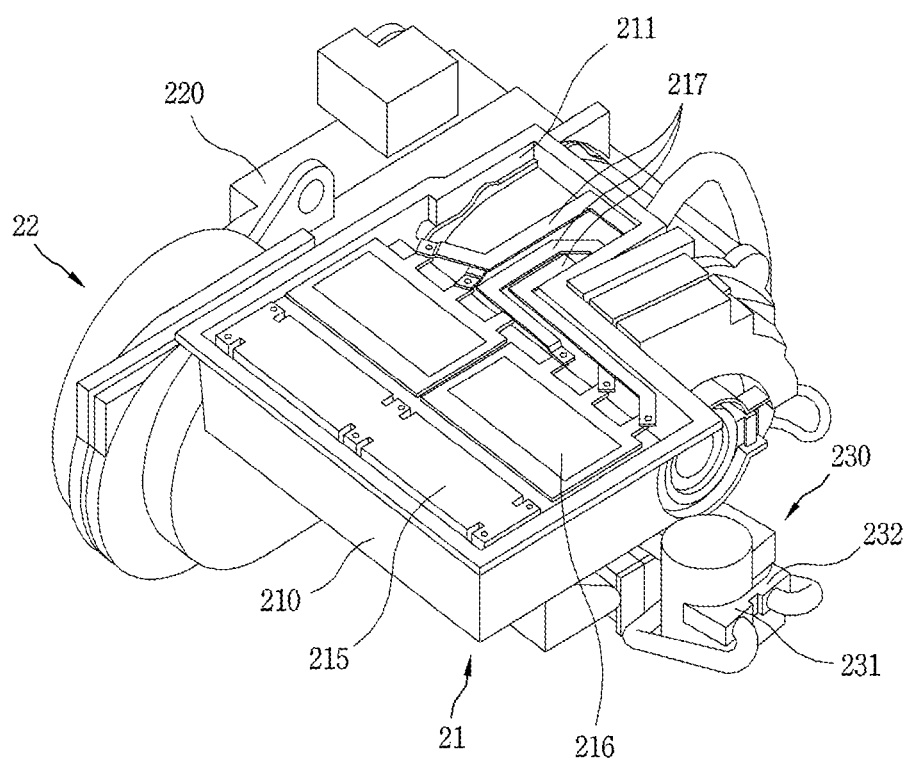
FIG. 3 is a perspective view illustrating a state in which an IGBT, a capacitor, and bus bars are mounted inside an inverter after an inverter cover and a cooling plate are removed in FIG. 1.
Figure 4:
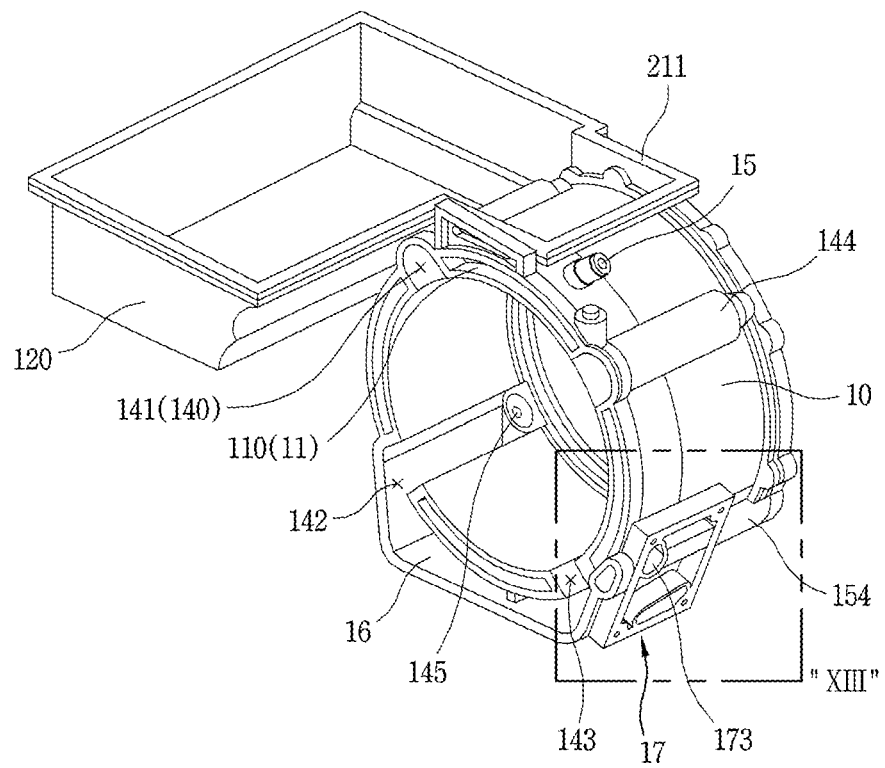
FIG. 4 is a perspective view illustrating a direction in which an assembly of a stator and a rotor is mounted to a motor housing and a direction in which internal parts of an inverter are mounted to an inverter housing in FIG. 2.

FIG. 1 is a perspective view of an intelligent power generation module (IPGM) in accordance with implementations of the present disclosure, FIG. 2 is an exploded view of the IPGM in FIG. 1, FIG. 3 is a perspective view illustrating a state in which an IGBT 216, a capacitor 215, and bus bars 217 are mounted inside an inverter 21 after an inverter cover 212 and a cooling plate 214 are removed in FIG. 1, and FIG. 4 is a perspective view illustrating a direction in which an assembly of a stator 24 and a rotor 25 is mounted to a motor housing 10 and a direction in which internal parts of the inverter 21 are mounted to an inverter housing 210 in FIG. 2.

Figure 5:
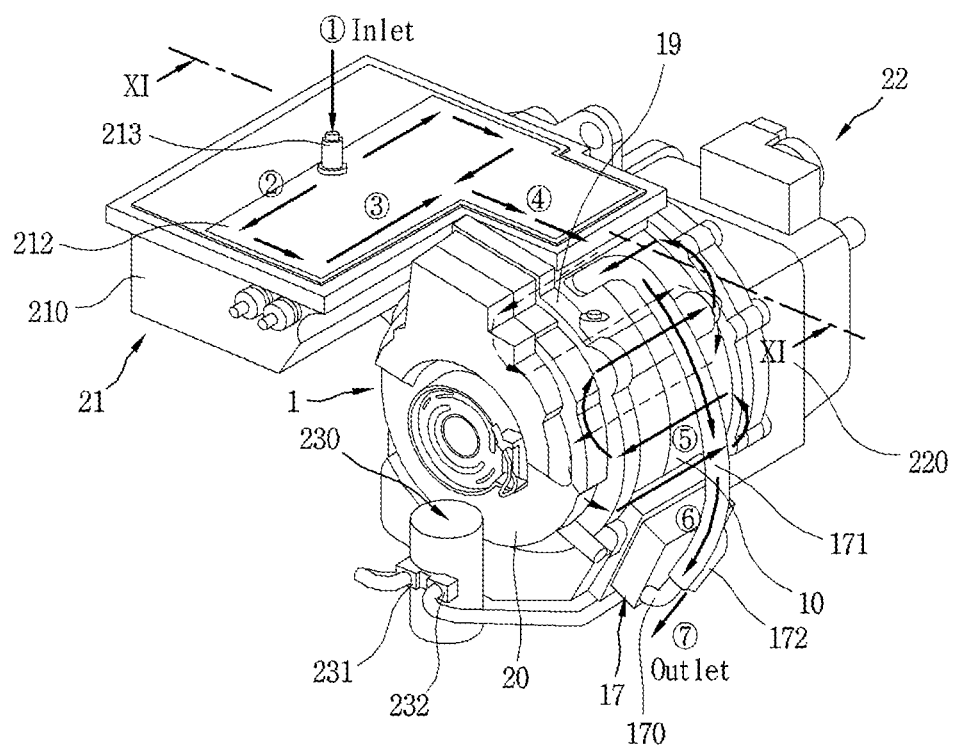
FIG. 5 illustrates a movement path of cooling water in FIG. 1.
Figure 6:
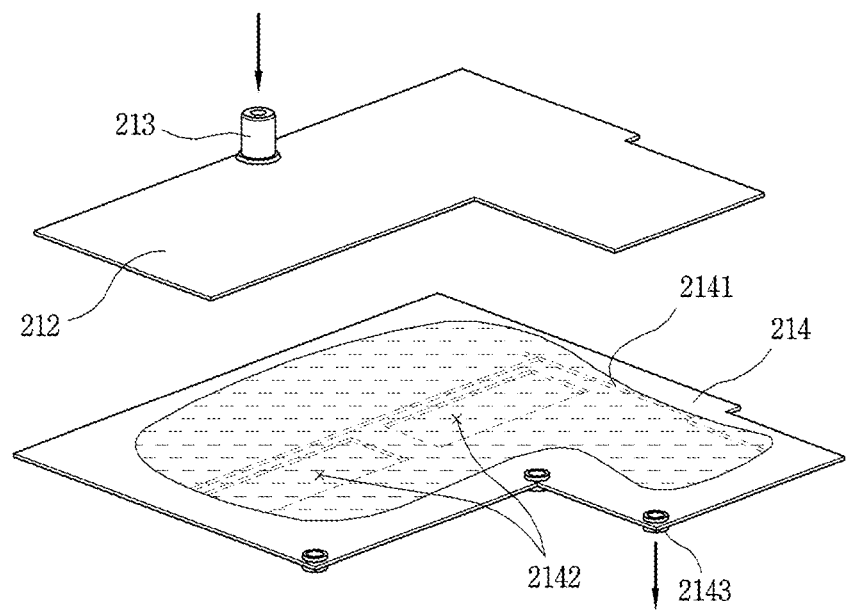
FIG. 6 illustrates inflow and outflow paths of cooling water in the inverter housing of FIG. 5.
Figure 7:
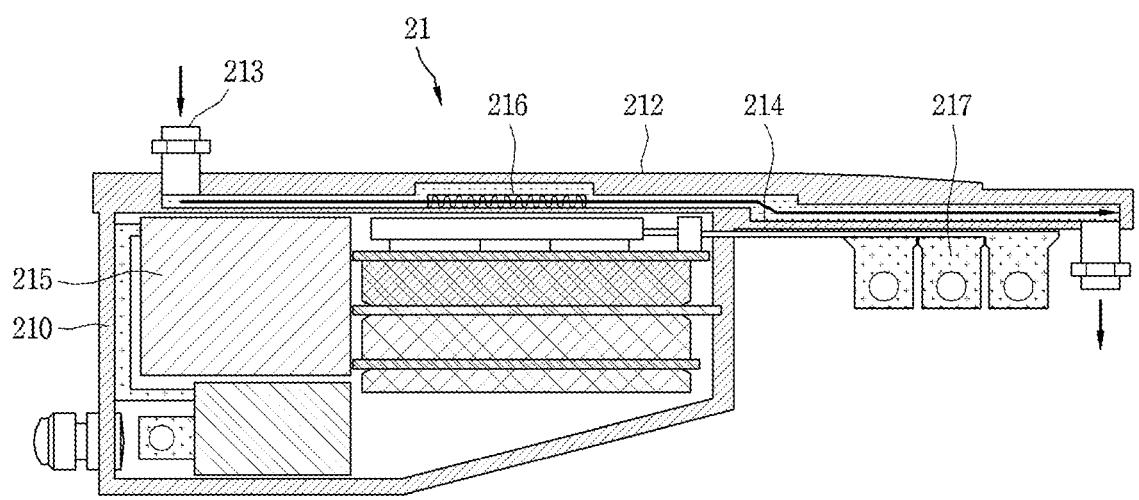
FIG. 7 is a cross-sectional view illustrating a path through which cooling water moves from the inverter housing to the motor housing in FIG. 5.
Figure 8:
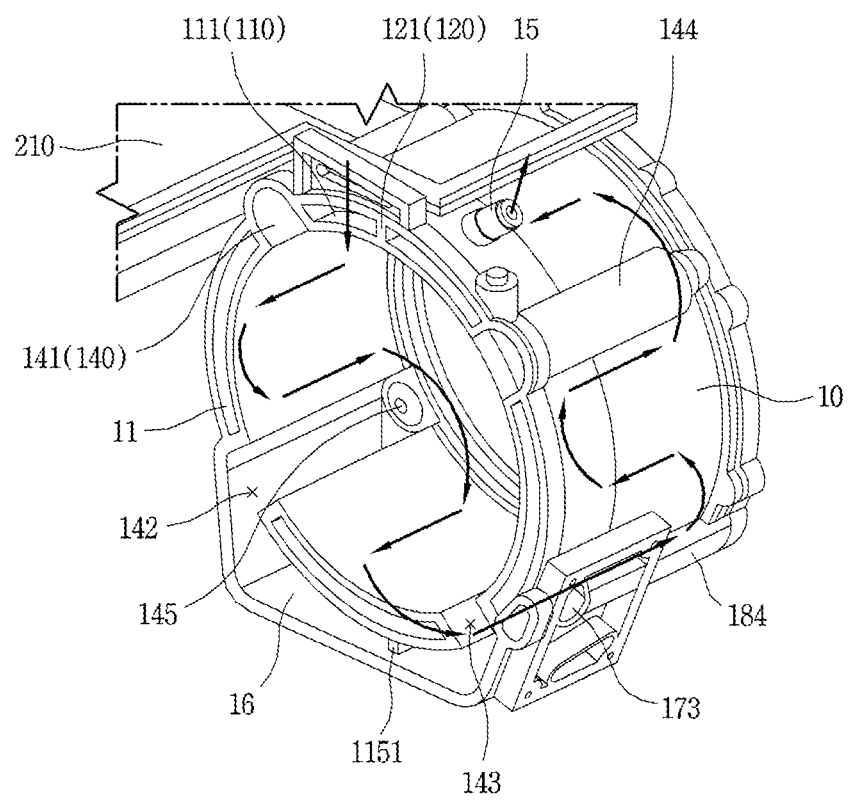
FIG. 8 illustrates a path in which the cooling water moves in a zigzag form along a cooling water flow path inside the motor housing in FIG. 5.
Figure 9:
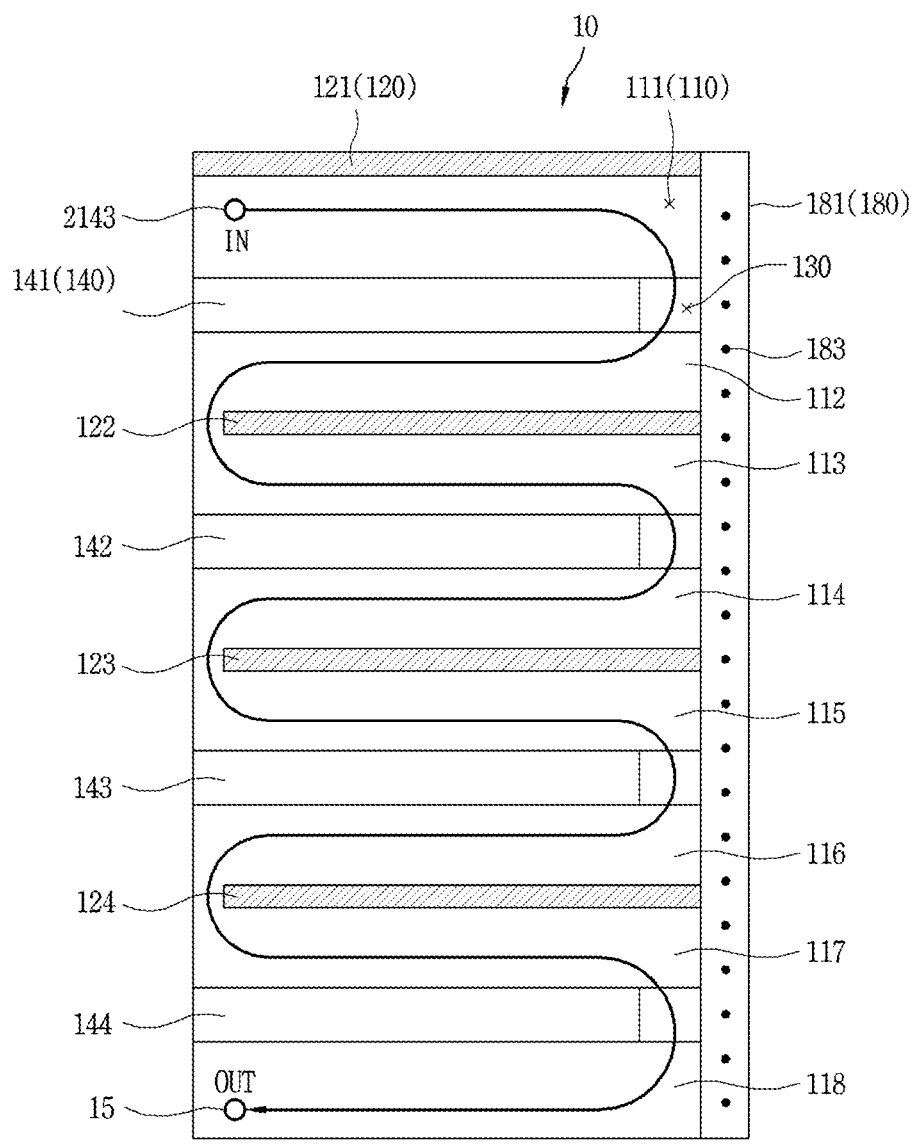
FIG. 9 is an exploded view illustrating a cooling water flow path of FIG. 8 deployed on a plane, which illustrates a movement path of the cooling water.

FIG. 5 illustrates a movement path of cooling water in FIG. 1, FIG. 6 illustrates inflow and outflow paths of cooling water in the inverter housing 210 of FIG. 5, FIG. 7 is a cross-sectional view illustrating a path through which cooling water moves from the inverter housing 210 to the motor housing 10 in FIG. 5, FIG. 8 illustrates a path in which the cooling water moves in a zigzag form along a cooling water flow path 11 inside the motor housing 10 in FIG. 5, and FIG. 9 is an exploded view illustrating a cooling water flow path 11 of FIG. 8 deployed on a plane, which illustrates a movement path of the cooling water.

An intelligent power generation module (IPGM) according to implementations of the present disclosure may include an electric motor 1, the inverter 21, and a gearbox 22.

The electric motor 1 may include the stator 24 and the rotor 25 and generate power.

The stator 24 and the rotor 25 may be received inside the motor housing 10. The motor housing 10 may be formed in a cylindrical shape. An accommodation space for accommodating the stator 24 and the rotor 25 may be defined in the motor housing 10. An oil sump 16 may be defined at a lower surface of the motor housing 10. The oil sump 16 may fluidly communicate with the accommodation space of the motor housing 10 and may temporarily store oil.

The stator 24 may include a stator core 240 and a stator coil 242. The stator coil 242 may be wound around slots that are spaced apart from one another in a circumferential direction of the stator core 240. Parts of the stator coil 242 may protrude axially to both ends of the stator core 240 oriented in a lengthwise (longitudinal) direction of the stator core 240. The parts of the stator coil 242 protruding to the both ends of the stator core 240 may be referred to as end turns.

The stator coil 242 may be configured as a three-phase (U, W, and V-phase) coil and may be connected to a three-phase AC power source. A connection ring may be mounted to the stator coil 242 and include a bus bar 217 for connecting a power connecting portion for applying power to the three-phase coils of the stator coil 242 to neutral lines disposed on ends of the three-phase coils.

The power connecting portion may include three-phase terminals. The power connecting portion may be integrally formed with the connection ring.

The rotor 25 may be rotatably disposed in the stator core 240 with an air gap therebetween. The rotor 25 may include a rotor core and permanent magnets. A rotating shaft 26 may be coupled into the rotor core to be rotatable together with the rotor core.

Both end portions of the rotating shaft 26 may be rotatably supported by bearings.

A resolver may be disposed on one side of the rotating shaft 26 in a longitudinal direction of the rotating shaft 26.

Another side of the rotating shaft 26 may be connected to a driving shaft of the gearbox 22.

The gearbox 22 may include a gearbox housing 220 and gears provided inside the gearbox housing 220. The gears may be configured to reduce the number of turns occurred at the rotating shaft 26 of the electric motor 1 and increase a torque. The gears may be configured as a planetary gear set. The planetary gear set may include a ring gear, a sun gear, a planetary gear, a carrier, and the like.

The motor housing 10 may be formed in a cylindrical shape, and both sides of the motor housing 10 in the longitudinal direction may be open.

A housing 19 for oil injection (hereinafter, referred to as an oil injection housing 19) and a shield cover 20 may be coupled to one open end portion of the motor housing 10.

Another end portion of the motor housing 10 may be covered by the gearbox housing 220. A plurality of coupling portions may be formed on the one end portion of the motor housing 10 to be coupled to the gearbox housing 220.

The inverter 21 may include a capacitor 215 and an IGBT 216 to operate the electric motor 1.

An inverter housing 210 may be formed in a rectangular shape extending along the longitudinal direction of the motor housing 10. A connecting portion 211 may extend from one side surface of the inverter housing 210 to cover a top portion of the motor housing 10.

The connecting portion 211 may be integrally formed on a circumferential surface of the motor housing 10. The inverter housing 210 may extend in a tangential direction with respect to the circumferential surface of the motor housing 10.

The motor housing 10 and the inverter housing 210 may be integrally formed with each other, so that the electric motor 1 and the inverter 21 can be integrated. When the inverter 21 and the electric motor are configured as a single housing, a manufacturing cost can be reduced and its strength can be improved.

An upper portion of the inverter housing 210 may be open, and an inverter cover 212 may be detachably coupled to the upper opening of the inverter housing 210.

A cooling plate 214 may be mounted on an upper portion of the inverter housing 210. The cooling plate 214 may have a shape corresponding to the shape of the inverter housing 210. The inverter cover 212 may be mounted on an upper portion of the cooling plate 214 to cover a part or all of the cooling plate 214.

An inverter assembly such as the capacitor 215 and the IGBT 216 may be accommodated inside the inverter housing 210.

The capacitor 215, the IGBT 216, and the plurality of bus bars 217 may be accommodated inside the inverter housing 210 while being suspended upside down from a lower surface of the cooling plate 214.

With this configuration, heat generated from each of the capacitor 215, the IGBT 216, and the plurality of bus bars 217 can be efficiently cooled by the cooling plate 214 due to a temperature difference between the cooling plate 214 and an upper end portion of each of the capacitor 215, the IGBT 216, and the plurality of bus bars 217.

The capacitor 215, the IGBT 216, and the plurality of bus bars 217 may be disposed in this order, with the capacitor 215 being disposed farthest apart from the uppermost end of the motor housing 10 in the tangential direction. The three-phase terminal of the power connecting portion of the electric motor 1 may be disposed at the uppermost end of the motor housing 10.

The shield cover 20 may cover the three-phase terminal of the power connecting portion.

A cooling water flow path may be defined at an inner side of the cooling plate 214. A cooling water flow path forming groove 2141 may be formed in an inner side of the cooling plate 214. The cooling water flow path forming groove 2141 may be formed over an entire area of the cooling plate 214 and may have a shallow depth.

The cooling water flow path forming groove 2141 having this structure can allow even a small amount of cooling water to come in contact with the capacitor 215 and the IGBT 216 in an area as wide as possible, thereby improving cooling performance of the cooling water.

A heat absorbing surface may be formed on one side surface of the IGBT 216. The heat absorbing surface may come in contact with the cooling plate 214 or directly with the cooling water. In the implementation, an opening 2142 may be formed through a lower surface of the cooling plate 214 such that the IGBT 216 can come in direct contact with cooling water. Accordingly, the cooling water and the heat absorbing surface can come in contact with each other through the opening 2142. The opening 2142 and the heat absorbing surface may have the same shape and size. In this case, a sealing member may be disposed between the cooling plate 214 and the heat absorbing surface to restrict leakage of the cooling water from the cooling plate 214 to the inner space of the inverter housing 210.

With this configuration, the cooling water can directly absorb heat from the IGBT 216 through the heat absorbing surface so as to improve cooling performance.

The plurality of bus bars 217 may be disposed close to the three-phase terminal of the power connector of the electric motor 1. One side of each of the plurality of bus bars 217 may be connected to the capacitor 215 and the IGBT 216, and another side of each of the plurality of bus bars 217 may be connected to the three-phase terminal of the power connector. Accordingly, the inverter 21 can operate the electric motor 1.

With this configuration, a connection length of the bus bars 217 can be reduced and thus heat dissipation of the bus bars 217 can be reduced. Therefore, more heat can be cooled by the same amount of cooling water, result in improving cooling performance.

A cooling water inlet port 213 may be disposed on one side of the inverter cover 212.

One side of the cooling water inlet port 213 may be connected to fluidly communicate with the cooling water flow path of the cooling plate 214 and another side of the cooling water inlet port 213 may be connected to a radiator disposed in front of the vehicle, so that the cooling water cooled down by the radiator can be introduced into the cooling water flow path inside the inverter housing 210 through the cooling water inlet port 213.

A cooling water communication port 2143 may be formed through a lower surface of one side of the cooling plate 214.

One side of the cooling water communication port 2143 may be connected to fluidly communicate with the cooling water flow path and another side of the cooling water communication port 2143 may be connected to communicate with the cooling water flow path inside the motor housing 10.

The cooling water inlet port 213 may be disposed adjacent to the capacitor 215 and the cooling water communication port 2143 may be disposed adjacent to the plurality of bus bars 217.

The cooling water introduced through the cooling water inlet port 213 may sequentially cool down the capacitor 215, the IGBT 216, and the plurality of bus bars 217, and then flow into the motor housing 10 through the cooling water communication port 2143.

The motor housing 10 may be formed in a cylindrical shape with both sides open along the longitudinal direction.

The stator 24, the rotor 25, and the like may be accommodated in the motor housing 10 through one opening of the motor housing 10.

The stator core 240 may be formed in a cylindrical shape, and a plurality of ear parts 241 may protrude radially from an outer circumferential surface of the stator core 240. The plurality of ear parts 241 may extend along the longitudinal direction of the stator core 240. The plurality of ear parts 241 may be spaced apart from one another in a circumferential direction of the stator core 240.

Each of the plurality of ear parts 241 may have a bolt coupling hole therein. A plurality of bolts extending in the longitudinal direction of the stator core 240 may be inserted through the bolt coupling holes of the respective ear parts 241, such that the stator core 240 can be coupled to the motor housing 10.

A gearbox housing 220 may cover the rear end portion of the motor housing 10. A plurality of coupling portions that are spaced apart from one another in the circumferential direction may be formed on each of the front end portion of the gearbox housing 220 and the rear end portion of the motor housing 10. Coupling members such as bolts may be inserted through the coupling portions such that the gearbox housing 220 and the motor housing 10 can be coupled to each other.

The motor housing 10 may include a plurality of ear part accommodating portions 140. The plurality of ear part accommodating portions 140 may extend along the longitudinal direction of the motor housing 10 and protrude outward in the radial direction of the motor housing 10. The ear part accommodating portions 140 may surround the ear parts 241, respectively.

The plurality of ear parts 241 and the plurality of ear part accommodating portions 140 may be disposed on a left upper portion, a left lower portion, a right upper portion, and a right lower portion of the motor housing 10, respectively, at about intervals of 90 degrees when the motor housing 10 is viewed from the front in a direction in which the stator core 240 is inserted.

The ear part 241 may be formed in a semicircular shape, and upper two ear part accommodating portions 140 among the plurality of ear part accommodating portions 140 may be formed in a semicircular shape with a diameter larger than that of the ear part 241. Lower two ear part accommodating portions 140 among the plurality of ear part accommodating portions 140 may fluidly communicate with an upper portion of the oil sump 16.

The ear part accommodating portions 140 may be open toward the front in the longitudinal direction of the motor housing 10, such that the ear parts 241 can be inserted into the front openings of the ear part accommodating portions 140.

The stator and rotor assembly may be mounted by being inserted in the longitudinal direction of the motor housing 10. In this case, the ear parts 241 may be slidably coupled along the ear part accommodating portions 140. As the ear parts 241 and the ear part accommodating portions 140 are coupled to each other, the stator and rotor assembly may be allowed to be slidable in the longitudinal direction of the motor housing 10 but prevented from moving in the circumferential direction.

Coupling grooves 145 may be formed in rear end portions of the ear part accommodating portions 140 and bolts passing through the ear parts 241 may be coupled to the coupling grooves 145, so that the stator core 240 can be coupled to the motor housing 10.

The ear part accommodating portions 140 may be formed to have a cross-sectional area that increases from the rear to the front in the longitudinal direction, which may facilitate a mold to be smoothly released during molding by die casting.

The motor housing 10 may have a double wall. A cooling water flow path 11 may be defined between an outer wall and an inner wall in a radial direction of the double wall. The cooling water flow path 11 may include a plurality of heat-exchange cells 110, a plurality of partition walls 120, and a plurality of communication holes 130. The plurality of communication holes 130 may be disposed in the motor housing 10 to be spaced apart from one another in the circumferential direction.

Each of the plurality of heat-exchange cells 110 may extend in the longitudinal direction of the motor housing 10. Two heat-exchange cells 110 may be disposed between the two ear part accommodating portions 140 adjacent to each other in the circumferential direction.

The plurality of heat-exchange cells 110 may be defined by the plurality of partition walls 120 in the circumferential direction. Each of the plurality of partition walls 120 may extend in the longitudinal direction of the motor housing 10. The plurality of partition walls 120 may be spaced apart from one another in the circumferential direction.

Each of the plurality of partition walls 120 may protrude in the radial direction, such that an outer end thereof is connected to the outer wall of the motor housing 10 and an inner end thereof is connected to the inner wall of the motor housing 10.

The plurality of communication holes 130 may be alternately formed at front end portions of the plurality of partition walls 120 in the circumferential direction, such that two heat-exchange cells 110 adjacent to each other in the circumferential direction can fluidly communicate with each other.

The plurality of heat-exchange cells 110 may include a first heat-exchange cell 111 to an Nth heat-exchange cell 110. In this implementation, eight heat-exchange cells 110 may be provided.

Among the plurality of heat-exchange cells 110, the heat-exchange cell 110 fluidly communicating with the cooling water communication port 2143 may be referred to as a first heat-exchange cell 111.

Among the plurality of heat-exchange cells 110, the heat-exchange cell 110 fluidly communicating with a cooling water outlet port 15 may be referred to as an eighth heat-exchange cell 118.

The first heat-exchange cell 111 and the eighth heat-exchange cell 118 may be disposed adjacent to each other in the circumferential direction. A partition wall disposed at the uppermost end of the motor housing 10 among the plurality of partition walls 120 may be referred to as a first partition wall 121.

The first partition wall 121 may be disposed between the first heat-exchange cell 111 and the eighth heat-exchange cell 118 to partition the first heat-exchange cell 111 and the eighth heat-exchange cell 118 from each other. In implementations, the communication hole 130 is not formed at the front or rear end portion of the first partition wall 121. If the communication hole 130 is provided at the first partition wall 121, cooling water would move from the first heat-exchange cell 111 directly to the eighth heat-exchange cell 118 through the communication hole 130 without substantial heat exchange prior to being discharged through the cooling water outlet port 15.

The second heat-exchange cell 112 may be spaced apart from the first heat-exchange cell 111 in a counterclockwise direction when viewed from the front of the motor housing 10. The first ear part accommodating portion 141 located at the left upper portion may be disposed between the first heat-exchange cell 111 and the second heat-exchange cell 112.

The third heat-exchange cell 113 may be spaced apart from the second heat-exchange cell 112 in the counterclockwise direction, and the communication hole 130 may be formed at the front end portion of the second partition wall 122 by which the second heat-exchange cell 112 and the third heat-exchange cell 113 are partitioned from each other.

The fourth heat-exchange cell 114 may be spaced apart from the third heat-exchange cell 113 in the counterclockwise direction with interposing the second ear part accommodating portion 142 located at the left lower portion therebetween.

The fifth heat-exchange cell 115 may be spaced apart from the fourth heat-exchange cell 114 in the counterclockwise direction, and the communication hole 130 may be formed at the front end portion of the third partition wall 123 by which the fourth heat-exchange cell 114 and the fifth heat-exchange cell 115 are partitioned from each other.

The oil sump 16 may be disposed in a lower portion of the motor housing 10. The oil sump 16 may be formed in a rectangular or trapezoidal shape.

The oil sump 16 may fluidly communicate with a circular inner space of the motor housing 10. Accordingly, oil sprayed into the inner space of the motor housing 10 may be temporarily stored in a lower portion of the oil sump 16. The oil sump 16 and the circular inner space may be partitioned by the fourth and fifth heat-exchange cells 114 and 115 disposed at the lower portion among the plurality of heat-exchange cells 110.

A support rib 1151 may extend on a lower surface of the fourth heat-exchange cell 114 or the fifth heat-exchange cell 115 in the longitudinal direction of the motor housing 10, to support the fourth heat-exchange cell 114 and the fifth heat-exchange cell 115. An upper end portion of the support rib 1151 may be connected to the lower surface of the fourth heat-exchange cell 114 or the fifth heat-exchange cell 115, and a lower end portion of the support rib 1151 may be connected to a bottom surface of the oil sump 16.

The sixth heat-exchange cell 116 may be spaced apart from the fifth heat-exchange cell 115 in the counterclockwise direction with interposing the third ear part accommodating portion 143 therebetween. The sixth heat-exchange cell 116 may be formed in a right surface of the motor housing 10 to face the third heat-exchange cell 113.

The seventh heat-exchange cell 117 may be spaced apart from the sixth heat-exchange cell 116 in the counterclockwise direction. The fourth partition wall 124 may partition the sixth heat-exchange cell 116 and the seventh heat-exchange cell 117 from each other, and the communication hole 130 may be formed at the front end portion of the fourth partition wall 124.

The eighth heat-exchange cell 118 may be spaced apart from the seventh heat-exchange cell 117 in the counterclockwise direction with interposing the fourth ear part accommodating portion 144 located at the right upper portion therebetween.

The communication holes 130 may be formed at the rear of the coupling grooves 145 of the first to fourth ear part accommodating portions 141 to 144, respectively. The communication hole 130 formed at the rear of the first ear part accommodating portion 141 may allow the first heat-exchange cell 111 and the second heat-exchange cell 112 to fluidly communicate with each other in the circumferential direction.

The communication hole 130 formed at the rear of the second ear part accommodating portion 142 may allow the third heat-exchange cell 113 and the fourth heat-exchange cell 114 to fluidly communicate with each other in the circumferential direction.

The communication hole 130 formed at the rear of the third ear part accommodating portion 143 may allow the fifth heat-exchange cell 115 and the sixth heat-exchange cell 116 to fluidly communicate with each other in the circumferential direction.

The communication hole 130 formed at the rear of the fourth ear part accommodating portion 144 may allow the seventh heat-exchange cell 117 and the eighth heat-exchange cell 118 to fluidly communicate with each other in the circumferential direction.

The cooling water outlet port 15 may be formed at the upper portion of the motor housing 10. A lower end portion of the cooling water outlet port 15 may communicate with the eighth heat-exchange cell 118, and an upper end portion of the cooling water outlet port 15 may fluidly communicate with the outside.

A heat exchanger 17 may be installed on one side of an outer surface of the motor housing 10. The heat exchanger 17 may be provided to allow heat exchange between oil and cooling water. A part of the heat exchanger 17 may overlap an outer surface of the sixth heat-exchange cell 116 in the radial direction and another part of the heat exchanger 17 may overlap one side surface of the oil sump 16 in a thickness direction.

The heat exchanger 17 may be provided with a cooling water suction port 170. The cooling water outlet port 15 of the motor housing 10 may be connected to the cooling water suction port 170 of the heat exchanger 17. One side of a cooling water connection pipe 171 may be connected to the cooling water outlet port 15 and another side of the cooling water connection pipe 171 may be connected to the cooling water suction port 170 of the heat exchanger 17.

The cooling water flow path 11 may be defined in the heat exchanger 17. The cooling water suction port 170 may be connected to the cooling water flow path 11, and a cooling water discharge port 172 may be provided at the heat exchanger 17 to fluidly communicate with the cooling water flow path 11.

The cooling water discharge port 172 may be connected to a radiator disposed in the front of the vehicle by a cooling water circulation line.

With this configuration, the cooling water may first be cooled in the radiator and then flow into the cooling water inlet port 213 formed through the inverter cover 212. The cooling water can sequentially cool down the capacitor 215, the IGBT 216, and the bus bars 217 accommodated in the inverter housing 210 while moving along the cooling water flow path 11 defined in the cooling plate 214.

Subsequently, the cooling water may move from the inverter housing 210 into the motor housing 10 through the cooling water communication port 2143. The cooling water communication port 2143 may fluidly communicate with the first heat-exchange cell 111 of the motor housing 10, such that the cooling water can move into the first heat-exchange cell 111.

The cooling water may then sequentially flow along the first to eighth heat-exchange cells 111 to 118 in the circumferential direction (counterclockwise), thereby cooling down the electric motor 1.

Afterwards, the cooling water flowing out through the cooling water outlet port 15 of the eighth heat-exchange cell 118 may move into the heat exchanger 17 through the cooling water connection pipe 171 so as to exchange heat with oil, thereby cooling down the oil.

The heat-exchanged cooling water may move to the radiator through the cooling water discharge port 172 of the heat exchanger 17 and emit heat to air in the radiator, and then circulate back to the cooling water inlet port 213 of the inverter cover 212, thereby cooling down the inverter 21. A water pump of the vehicle may supply circulating power to the cooling water so as to transfer the cooling water discharged through the cooling water discharge port 172 to the radiator and circulate the cooling water from the radiator back to the cooling water inlet port 213.

Figure 10:
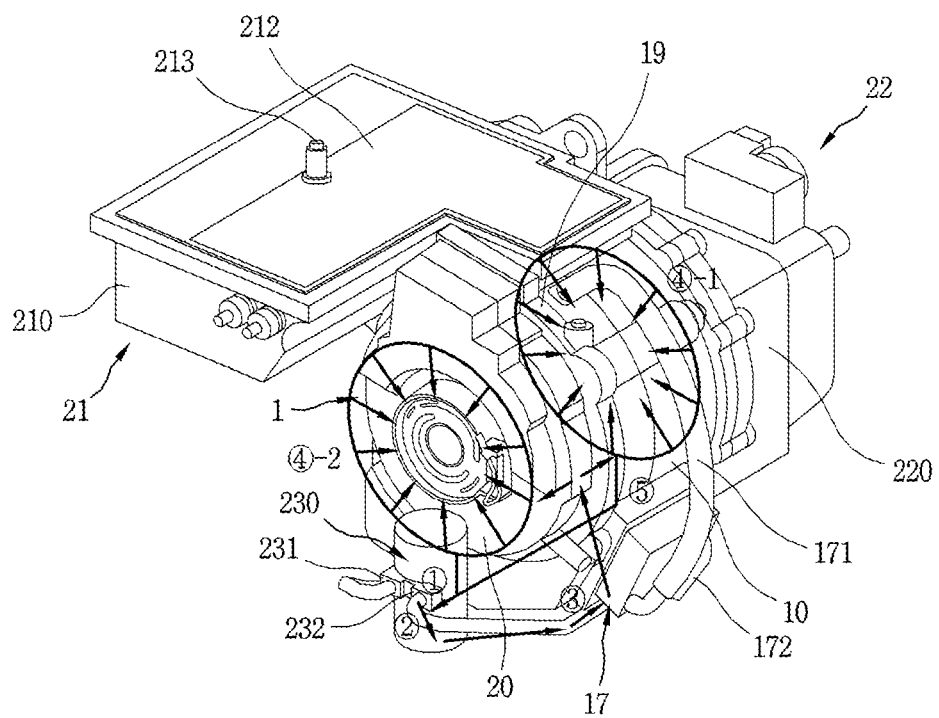
FIG. 10 illustrates a movement path of oil in FIG. 1.
Figure 11:
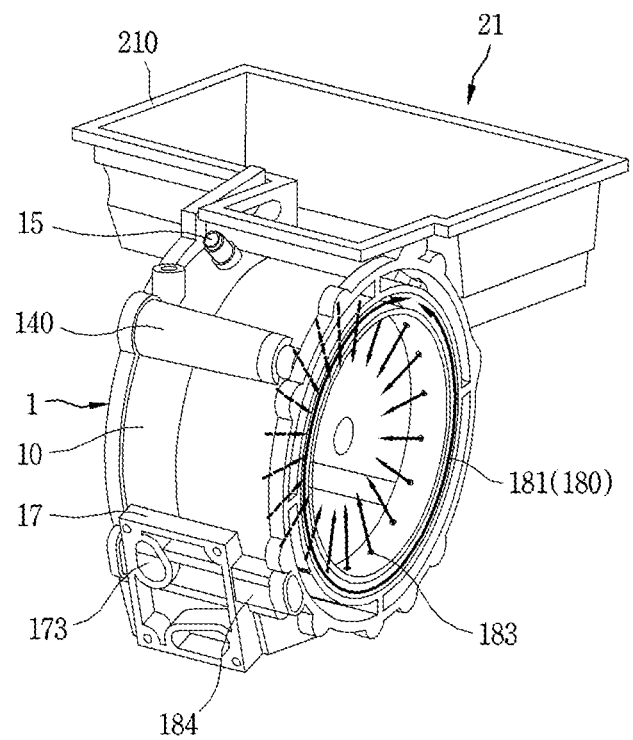
FIG. 11 illustrates a state in which oil is sprayed through injection holes in all sections along a circumferential direction of the motor housing in FIG. 9 and an oil flow path forming part formed in a gearbox housing.
Figure 11:
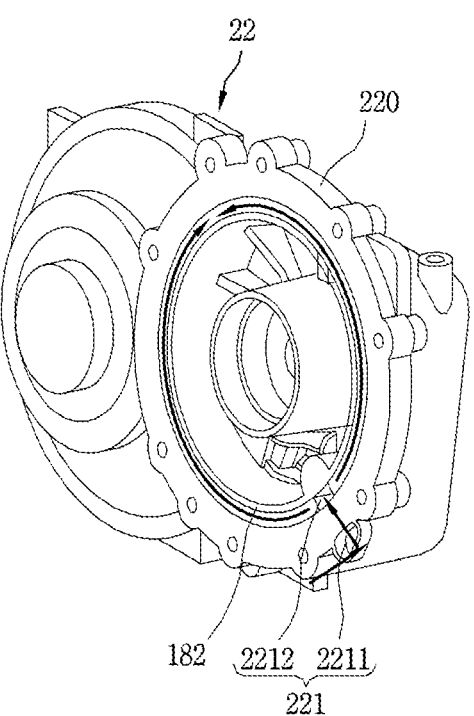
Figure 12:
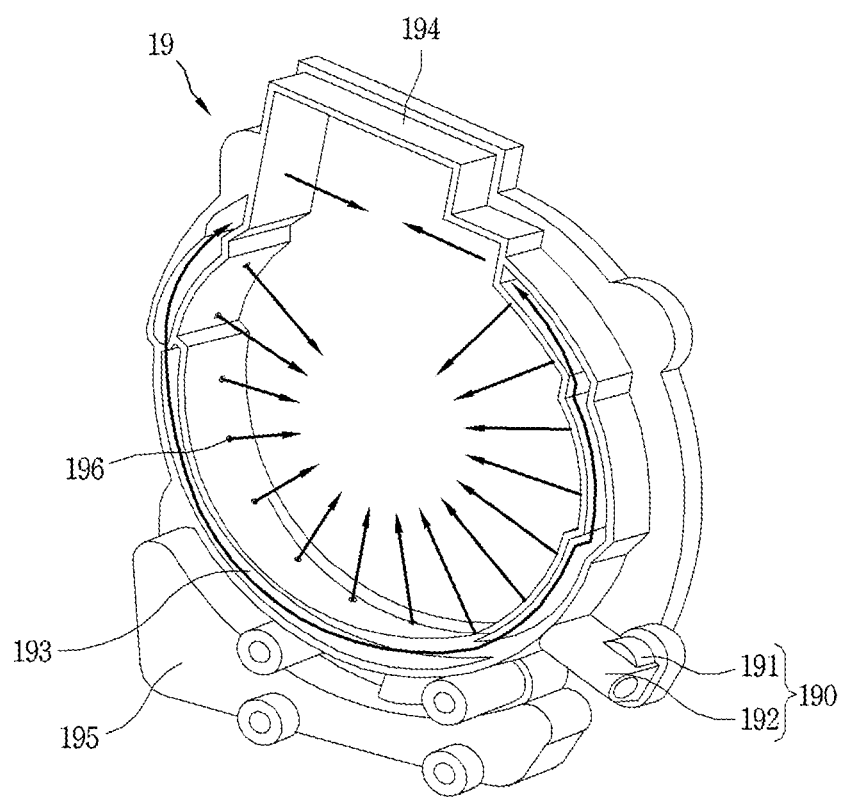
FIG. 12 illustrates a path through which oil is sprayed in all sections along a circumferential direction of a housing for oil injection of FIG. 2.
Figure 13:
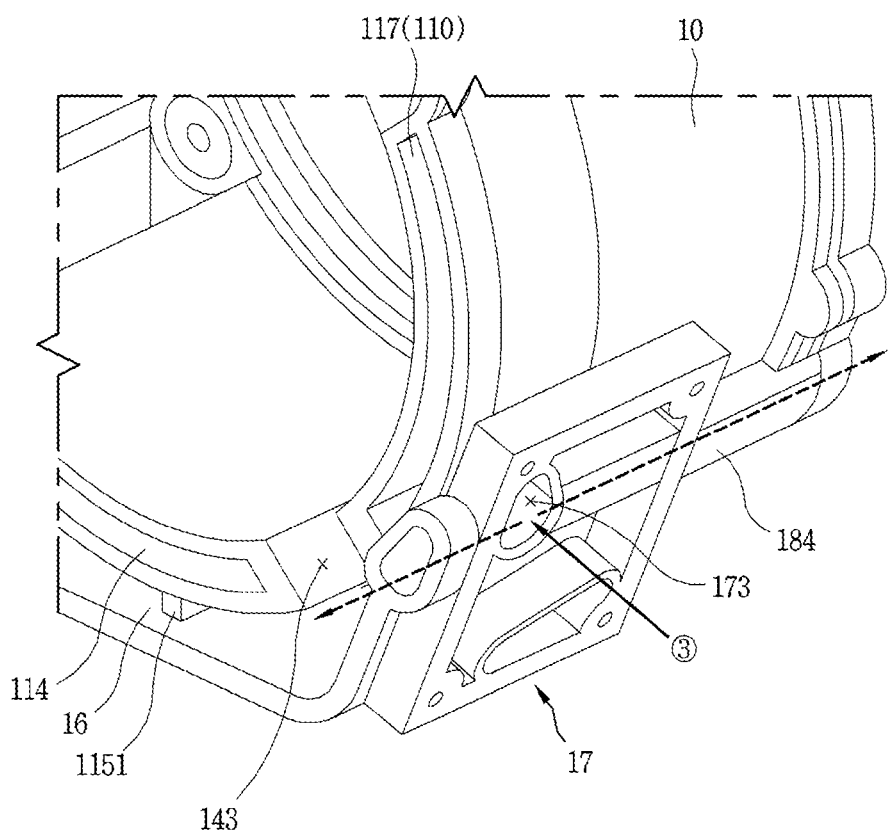
FIG. 13 is an enlarged view of a part "XIII" in FIG. 4, which illustrates a path through which oil is diverged from a heat exchanger into the motor housing.

FIG. 10 illustrates a movement path of oil in FIG. 1, FIG. 11 illustrates a state in which oil is sprayed through injection holes in all sections along a circumferential direction of the motor housing 10 in FIG. 9 and a second oil flow path forming part formed in the gearbox housing 220, FIG. 12 illustrates a path through which oil is sprayed in all sections along a circumferential direction of an oil injection housing 19 of FIG. 2, and FIG. 13 is an enlarged view of a part "XIII" in FIG. 4, which illustrates a path through which oil is diverged from the heat exchanger 17 into the motor housing 10.

An oil flow path 180 along which oil flows may be defined inside each of the motor housing 10 and the gearbox housing 220. The oil flow path 180 may include a first oil flow path forming part 181 and a second oil flow path forming part 182 provided in the motor housing 10 to face each other in the longitudinal direction.

The first oil flow path forming part 181 may extend from the rear end portion of the motor housing 10 in the circumferential direction, and may be open to the rear of the motor housing 10.

The first oil flow path forming part 181 may extend in the longitudinal direction of the motor housing 10. The first oil flow path forming part 181 may be defined at an inner side of the motor housing 10.

The first oil flow path forming part 181 may be configured as a double wall. The first oil flow path forming part 181 may share the rear end portion of the inner wall of the motor housing 10 as its outer wall. An inner wall of the first oil flow path forming part 181 may be spaced apart radially inward from the rear end portion of the inner wall of the motor housing 10.

The second oil flow path forming part 182 may extend concavely in an inner surface of the gearbox housing 220 along the circumferential direction. The second oil flow path forming part 182 may be configured as a double wall. The double wall of the second oil flow path forming part 182 may be disposed to face the double wall of the first oil flow path forming part 181 in the longitudinal direction to define a single oil flow path 180. The single oil flow path 180 may be defined along the circumferential direction.

A plurality of first injection nozzles 183 may be radially formed through the inner wall of the first oil flow path forming part 181. The plurality of first injection nozzles 183 may be spaced apart from one another in the circumferential direction of the first oil flow path forming part 181.

An oil suction part 221 may be formed on one side of the gearbox housing 220. The oil suction part 221 may include a first oil suction portion 2211 extending from the rear of the motor housing 10 toward the gearbox housing 220 in the axial direction, and a second oil suction portion 2212 extending from the first oil suction portion 2211 in the radial direction.

Oil introduced into the oil flow path 180 through the oil suction part 221 may be split in half (½) into opposite directions at one point of the oil flow path 180, so as to be distributed into the plurality of first injection nozzles 183 while rotating from the one point to an opposite point spaced apart by 180 degrees, thereby being sprayed into the inner space of the motor housing 10 in the radial direction.

The oil may be directly sprayed onto the end turn of the stator coil 242 protruding axially from the rear end portion in the longitudinal direction of the stator core 240, to absorb heat generated in the stator coil 242.

The oil that has been split, rotate, and move in the opposite directions may reunite at the opposite point.

An oil pump 230 may be mounted on a lower portion of a front surface of a housing 19 for oil injection (i.e., oil injection housing 19). A pump inlet 231 may be disposed at one side of the oil pump 230. The pump inlet 231 may fluidly communicate with a bottom surface of the oil sump 16 through an oil suction pipe.

The oil pump 230 may pump up oil from the oil sump 16.

A pump outlet 232 may be disposed at another side of the oil pump 230. The pump outlet 232 may fluidly communicate with an oil suction port disposed at one side of the heat exchanger 17 through an oil discharge pipe. The pumped oil may flow into the heat exchanger 17.

An oil distribution flow path 184 may extend along the longitudinal direction of the motor housing 10. A front end portion of the oil distribution flow path 184 in the longitudinal direction may fluidly communicate with the oil suction part 221 of the oil injection housing 19 and a rear end portion of the oil distribution flow path 184 in the longitudinal direction may fluidly communicate with the oil suction part 221 of the gearbox housing 220.

An oil discharge port 173 may be disposed in the heat exchanger 17. The oil discharge port 173 may fluidly communicate with a middle portion of the oil distribution flow path 184.

The heat exchanger 17 may include the oil flow path 180 and the cooling water flow path 11 to allow the heat exchange between oil and cooling water.

Oil may be suctioned into the heat exchanger 17, cooled by heat exchange with cooling water, and then divergently flow from the oil distribution flow path 184 toward the front end portion and the rear end portion in the longitudinal direction through the oil discharge port 173.

The oil may be introduced from the rear end portion of the oil distribution flow path 184 into the second oil flow path forming part 182 through the oil suction part 221 of the gearbox housing 220. The oil may then be split in half into opposite directions at the suction point of the second oil flow path forming part 182 and be distributed into the plurality of first injection nozzles 183 while rotating along the circumferential direction. The oil may thus be sprayed onto the stator coil 242 through the plurality of first injection nozzles 183. Accordingly, the electric motor 1 can be cooled simultaneously by oil and cooling water.

The oil injection housing 19 may be coupled to the front end portion of the motor housing 10. The oil injection housing 19 may include an oil manifold 193, a power connector cover portion 194, and an oil sump cover portion 195.

The oil manifold 193 may protrude with a small diameter from one side surface of the oil injection housing 19 in the longitudinal direction of the motor housing 10 and extend in the circumferential direction. The oil manifold 193 may have a double-wall structure.

An outer wall and an inner wall of the oil manifold 193 may be radially spaced apart from each other to define the oil flow path 180 such that oil can flow between the outer wall and the inner wall. A plurality of second injection nozzles 196 may be radially formed through the inner wall of the oil manifold 193.

The plurality of second injection nozzles 196 may be spaced apart from one another in the circumferential direction, to spray oil in all sections of 360 degrees in the circumferential direction.

The oil injection housing 19 may cover the cooling water flow path 11 of the motor housing 10.

The power connector cover portion 194 may protrude upward from an upper portion of the oil injection housing 19 to surround the power connector.

The oil sump cover portion 195 may protrude downward from a lower portion of the oil injection housing 19, to cover a front opening of the oil sump 16.

The shield cover 20 may be coupled to cover the power connector cover portion 194 and the oil manifold 193 of the oil injection housing 19.

An oil suction part 190 may extend radially from one side of the oil injection housing 19. One side of the oil suction part 190 may fluidly communicate with the oil manifold 193 and another side of the oil suction part 190 may be connected to the oil pump 230.

The oil suction part 190 may include a first oil suction portion 191 extending in the axial direction and a second oil suction portion 192 extending in a radial direction. The second oil suction portion 192 may be connected to the oil manifold 193.

Oil introduced into the oil manifold 193 through the oil suction part 190 may be split in half into opposite directions at one point of the oil manifold 193 in the circumferential direction. The split oil can thus move from the one point to another point opposite to the one point by 180 degrees along the opposite directions.

The two oil flows made in the opposite directions may reunite at the opposite one point. Therefore, the oil can be sprayed in the radial direction into the inner space of the motor housing 10 at all sections of 360 degrees through the plurality of second injection nozzles 196.

The oil may be directly sprayed onto the end turn of the stator coil 242 protruding axially from the front end portion in the longitudinal direction of the stator core 240, to absorb heat generated in the stator coil 242.

The oil may be introduced from the front end portion of the oil distribution flow path 184 into the oil manifold 193 through the oil suction part 190 of the oil injection housing 19. The oil may then be split in half at the suction point of the oil manifold 193 toward opposite directions so as to be distributed into the plurality of first injection nozzles 196 while rotating along the circumferential direction. The oil may thus be sprayed onto the stator coil 242 through the plurality of second injection nozzles 196. Accordingly, the electric motor 1 can be cooled simultaneously by oil and cooling water.

A first gasket may be disposed between the shield cover 20 and the oil injection housing 19 to seal a gap between the shield cover 20 and the oil injection housing 19. A second gasket may be disposed between the oil injection housing 19 and the motor housing 10 to seal a gap between the oil injection housing 19 and the motor housing 10. Also, a third gasket may be disposed between the motor housing 10 and the gearbox housing 220 to seal a gap between the motor housing 10 and the gearbox housing 220.

Therefore, according to implementations of the present disclosure, an electric motor can be cooled down simultaneously by cooling water flowing along the cooling water flow path 11 extending in the axial direction and oil flowing along the oil flow path 180 extending in the circumferential direction inside the motor housing 10, thereby improving cooling performance and motor output of the electric motor.

In addition, the plurality of first injection nozzles 183 may be disposed in a spaced manner along the circumferential direction in all sections of 360 degrees at the first oil flow path forming part 181, which is formed in the circumferential direction at the inner side of the rear end portion of the motor housing 10 in the longitudinal direction, and the plurality of second injection nozzles 196 may be disposed in a spaced manner along the circumferential direction at the oil manifold 193, which is formed in the circumferential direction inside the oil injection housing 19 mounted to the front end portion of the motor housing 10 in the longitudinal direction. Accordingly, oil can be sprayed directly onto the end turn of the stator coil 242 in all the sections of 360 degrees through the plurality of first injection nozzles 183 and second injection nozzles 196, thereby enhancing heat dissipation performance of the stator coil 242.

As oil is sprayed in all the sections of 360 degrees, the cooling performance of the oil can be uniformly maintained in the circumferential direction of the stator coil 242 even when an electronic vehicle turns, travels uphill or downhill, or is accelerated/decelerated. Further, it can prevent an occurrence of an oil cooling dead zone in which a portion of the stator coil 242 is not wetted by the oil.

Further, the cooling water flow path 11 of the motor housing 10 may be configured as an axial flow path extending in the axial direction so as to be manufactured by die casting, and the motor housing 10 does not have to be formed by gravity casting that has been employed to form a spiral flow path in related art, thereby improving productivity.

Moreover, the electric motor 1 can employ a cooling structure that can only use cooling water without an oil cooling structure, if necessary. For example, a low-cost product can be configured to have a cooling structure only using cooling water without the oil pump 230 and the heat exchanger 17.

In addition, a high output electric motor 1 can employ a cooling structure simultaneously using both oil and cooling water so as to continuously maintain a high output compared to a maximum output (e.g., 60% of the maximum output).

In addition, the inverter 21 and the electric motor can be configured by a single integrated housing, thereby reducing a manufacturing cost and improving strength.

The cooling water flow path 11 can extend in the axial direction and have a zigzag shape along the circumferential direction. Therefore, the structure of the cooling water flow path 11 along which the cooling water can circulate while avoiding positions of bolting holes can be achieved even when the stator 24 is not press-fitted into the motor housing 10 but is bolted to the motor housing 10 through ear parts 241 being formed at four places of the stator core 240.

The capacitor 215, the IGBT 216, and the bus bars 217 of the inverter 21 can be suspended compactly upside down from the lower surface of the cooling plate 214, so as to be cooled simultaneously by cooling water, thereby improving cooling performance of the inverter 21. Those electric components such as the capacitor 215 of the inverter 21 can be mounted upside down so as to reduce the length of the bus bars 217 for connection with the three-phase AC power source of the electric motor 1, which may result in reducing an amount of heat generated in the bus bars 217 and increasing cooling efficiency accordingly.

Cooling water can indirectly cool down the inverter 21 and the electric motor while moving along inner flow paths of the inverter housing 210 and the motor housing 10 and then absorb heat through heat exchange with oil in the heat exchanger 17, thereby enhancing heat dissipation performance.

Oil can be sprayed through the plurality of injection nozzles formed in the motor housing 10 at all sections of 360 degrees in the circumferential direction. Therefore, a guide ring for oil dropping is not additionally needed, thereby reducing the number of components and assembly processes and reducing a manufacturing cost.

What is claimed is:

1. A power generation module comprising:
    an electric motor including a stator, a rotor, and a motor housing that receives the stator and the rotor, the motor housing having first and second end portions between which the motor housing extends in a longitudinal direction;
    an inverter including a capacitor, an insulated-gate bipolar transistor (IGBT), bus bars, and an inverter housing that receives the capacitor, the IGBT, and the bus bars;
    a cooling water flow path defined at the motor housing to allow cooling water to flow therethrough;
    a first oil flow path defined at the first end portion of the motor housing and extending along a circumferential direction of the motor housing;
    a plurality of first injection nozzles spaced apart from one another along the first oil flow path and configured to spray oil from the first oil flow path toward an inner space of the motor housing;
    an oil injection housing mounted to the second end portion of the motor housing;
    a second oil flow path defined at the oil injection housing along the circumferential direction; and
    a plurality of second injection nozzles spaced apart from one another along the second oil flow path and configured to spray the oil from the second oil flow path toward the inner space of the motor housing.

2. The power generation module of claim 1, wherein the motor housing has an outer wall and an inner wall that are spaced apart in a radial direction,
    wherein the motor housing includes a first oil flow path forming part defining the first oil flow path between the outer wall and the inner wall, and
    wherein the plurality of first injection nozzles are positioned around 360 degrees in the circumferential direction.

3. The power generation module of claim 2, further comprising:
    a gearbox having gears and a gearbox housing that receives the gears, the gearbox being configured to decelerate speed of the electric motor.

4. The power generation module of claim 3, wherein the gearbox housing comprises a second oil flow path forming part, the second oil flow path forming part disposed to face the first oil flow path forming part to thereby define the first oil flow path by the first oil flow path forming part and the second oil flow path forming part.

5. The power generation module of claim 1, wherein the oil injection housing comprises:
    an oil manifold (i) having an outer wall and an inner wall that are spaced apart in a radial direction and (ii) defining the second oil flow path between the outer wall and the inner wall.

6. The power generation module of claim 5, wherein the oil injection housing comprises:
    a power connector cover portion protruding upward from an upper portion of the oil manifold and surrounding a power connector, the power connector configured to apply power to a stator coil.

7. The power generation module of claim 6, wherein the oil injection housing comprises:
    an oil sump cover portion protruding downward from a lower portion of the oil manifold and covering an oil sump, the oil sump being disposed at a lower portion of the motor housing and configured to store oil.

8. The power generation module of claim 1, further comprising:
    an oil pump mounted to the motor housing and configured to transfer oil from a lower portion of the motor housing to the plurality of first injection nozzles and the plurality of second injection nozzles.

9. The power generation module of claim 1, further comprising:
    a heat exchanger installed at a surface of the motor housing and configured to exchange heat between the cooling water and the oil.

10. The power generation module of claim 9, further comprising:
    an oil distribution flow path extending at an outer circumferential surface of the motor housing and across the heat exchanger in the longitudinal direction, the oil distribution flow path being configured to distribute oil to the first oil flow path and the second oil flow path, respectively; and
    an oil discharge port disposed at the heat exchanger and configured to fluidly communicate with the oil distribution flow path to thereby discharge oil from the heat exchanger to the oil distribution flow path.

11. The power generation module of claim 9, wherein a cooling water inlet port is defined through an inverter cover that covers the inverter housing, the cooling water inlet port configured to allow the cooling water to flow into the inverter housing therethrough.

12. The power generation module of claim 11, wherein a cooling water outlet port is defined through the heat exchanger and configured to allow the cooling water that is heat-exchanged with the oil to be discharged from the heat exchanger therethrough.

13. The power generation module of claim 1, wherein the motor housing and the inverter housing are integrally formed with each other, and wherein the inverter housing extends from an upper circumferential portion of the motor housing.

14. The power generation module of claim 13, wherein the inverter housing includes an upper portion that is open upward, and
wherein the inverter comprises:
a cooling plate configured to cover the open upper portion of the inverter housing and defining a cooling water flow path forming groove at an upper surface of the cooling plate, the cooling water flow path forming groove configured to allow the cooling water to flow to cool down the capacitor, the IGBT, and the bus bars; and
an inverter cover configured to cover the upper surface of the cooling plate.

15. The power generation module of claim 14, wherein the capacitor, the IGBT, and the bus bars are mounted to a lower surface of the cooling plate,
wherein a power connector is mounted at an upper portion of a stator coil, the power connector configured to apply three-phase power to the electric motor,
wherein the bus bars are disposed at a first distance from the power connector in a direction tangential to the circumferential direction,
wherein the capacitor is disposed at a second distance from the power connector in the direction, the second distance being greater than the first distance, and
wherein the IGBT is disposed between the capacitor and the bus bars.

16. The power generation module of claim 1, wherein the cooling water flow path comprises:
a plurality of heat-exchange cells extending in the longitudinal direction of the motor housing and spaced apart from one another in the circumferential direction of the motor housing;
a plurality of partition walls each disposed between adjacent heat-exchange cells of the plurality of heat-exchange cells and configured to partition the plurality of heat-exchange cells; and
a plurality of communication holes being defined through the plurality of partition walls such that the plurality of heat-exchange cells are in fluid communication with one another in the circumferential direction.

17. The power generation module of claim 16, wherein the stator comprises a plurality of ear parts that protrude radially outward from an outer circumferential surface of a stator core and are configured to couple the stator to the motor housing,
wherein the motor housing comprises a plurality of ear part accommodating portions that protrude radially outward from an outer circumferential surface of the motor housing and are configured to accommodate the plurality of ear parts, respectively, and
wherein the plurality of partition walls and the plurality of ear part accommodating portions are alternately disposed along the circumferential direction of the motor housing.

18. The power generation module of claim 17, wherein the plurality of ear parts are configured to receive a plurality of bolts, the plurality of bolts being configured to couple the stator to the motor housing.

19. The power generation module of claim 17, wherein the plurality of communication holes are disposed at end portions of the partition walls, respectively.

20. The power generation module of claim 17, wherein the plurality of communication holes are disposed at end portions of the plurality of ear part accommodating portions, respectively.

* * * * *